United States Patent
Rule et al.

(10) Patent No.: US 9,989,559 B2
(45) Date of Patent: Jun. 5, 2018

(54) SERIAL BIT STREAM REGULAR EXPRESSION WITH STATES

(71) Applicant: Tektronix, Inc., Beaverton, OR (US)

(72) Inventors: Keith D. Rule, Beaverton, OR (US); Edward F. Tanous, Lake Oswego, OR (US); James Feist, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 552 days.

(21) Appl. No.: 14/501,750

(22) Filed: Sep. 30, 2014

(65) Prior Publication Data
US 2015/0057978 A1    Feb. 26, 2015

Related U.S. Application Data

(63) Continuation-in-part of application No. 12/949,703, filed on Nov. 18, 2010, now Pat. No. 9,069,017.

(60) Provisional application No. 62/033,036, filed on Aug. 4, 2014, provisional application No. 61/266,966, filed on Dec. 4, 2009.

(51) Int. Cl.
*G01R 13/02*    (2006.01)

(52) U.S. Cl.
CPC .................. *G01R 13/0254* (2013.01)

(58) Field of Classification Search
CPC .............. G01R 13/0254; H04N 21/2343
USPC ......................................................... 702/189
See application file for complete search history.

(56) References Cited

U.S. PATENT DOCUMENTS

| | | | |
|---|---|---|---|
| 7,797,346 B2 | 9/2010 | Heuer et al. | |
| 9,069,017 B2* | 6/2015 | Rule | G01R 13/0254 |
| 2006/0245484 A1 | 11/2006 | Calvin | |
| 2007/0047457 A1 | 3/2007 | Harijono et al. | |
| 2008/0071765 A1 | 3/2008 | Ichiriu et al. | |
| 2008/0303443 A1 | 12/2008 | Tran | |
| 2011/0072151 A1 | 3/2011 | Sharma et al. | |
| 2011/0134979 A1* | 6/2011 | Rule | G01R 13/0254 |
| | | | 375/224 |
| 2015/0116136 A1* | 4/2015 | Cameron | G06F 17/277 |
| | | | 341/55 |

(Continued)

FOREIGN PATENT DOCUMENTS

EP    1139103 A1    10/2001

OTHER PUBLICATIONS

Brian W. Kernighan et al., Regular Expressions: Languages, algorithms, and software, Dr. Dobb's Journal, Apr. 1999, 4 pages.

(Continued)

*Primary Examiner* — Bryan Bui
(74) *Attorney, Agent, or Firm* — Marger Johnson; Kevin D. Dothager

(57) ABSTRACT

A test and measurement instrument includes a user interface and a controller. The controller is configured to receive a serial bit stream and apply a logic to the serial bit stream to identify states within the serial bit stream. The result of applying the logic to the serial bit stream is a combined state/bit stream. A regular expression can be applied to the combined state/bit stream: the regular expression can include state information. The controller is also configured to present output data through the user interface in response to the application of the regular expression to the combined state/bit stream.

19 Claims, 11 Drawing Sheets

(56) References Cited

U.S. PATENT DOCUMENTS

2015/0370234 A1* 12/2015 Lehane .............. G01R 13/0272
326/46

OTHER PUBLICATIONS

European Search Report, Application No. 15179730.5, dated Feb. 8, 2016, 8 pages, European Patent Office, Munich, Germany.
Divyasree J. Rajashekar, et al., "Dynamically Reconfigurable Regular Expression Matching Architecture", Application-Specific Systems, Architectures and Processors, 208, ASAP 2008. International Conference on, IEEE, Piscataway, NJ, USA. Jul. 2, 2008, pp. 120-125, XP031292387, IBSN: 978-1-4244-1897-8 (whole document).
Johnson et al., "Monitoring Regular Expressions on Out-of-Order Streams", 2007 IEEE, pp. 1315-1319.
Shakil A. Chunawala, "Creatr: A Generic Graphical Distributed Debugger with Language Support for Application Interfacing," Sep. 1994, M.S. Thesis, Department of Electrical Engineering and Computer Science, Massachusetts Institute of Technology, 86 pp.
Mitra et al., Compiling PCRE to FPGA for Accelerating SNORT IDS, Dec. 3-4, 2007, ACM/IEEE Symposium on Architectures for Networking and Communications Systems, Orlando, FL, 9 pp.
Bonesana et al., "An Adaptable FPGA-Based System for Regular Expression Matching," 2008 EDAA, pp. 1262-1267.

* cited by examiner

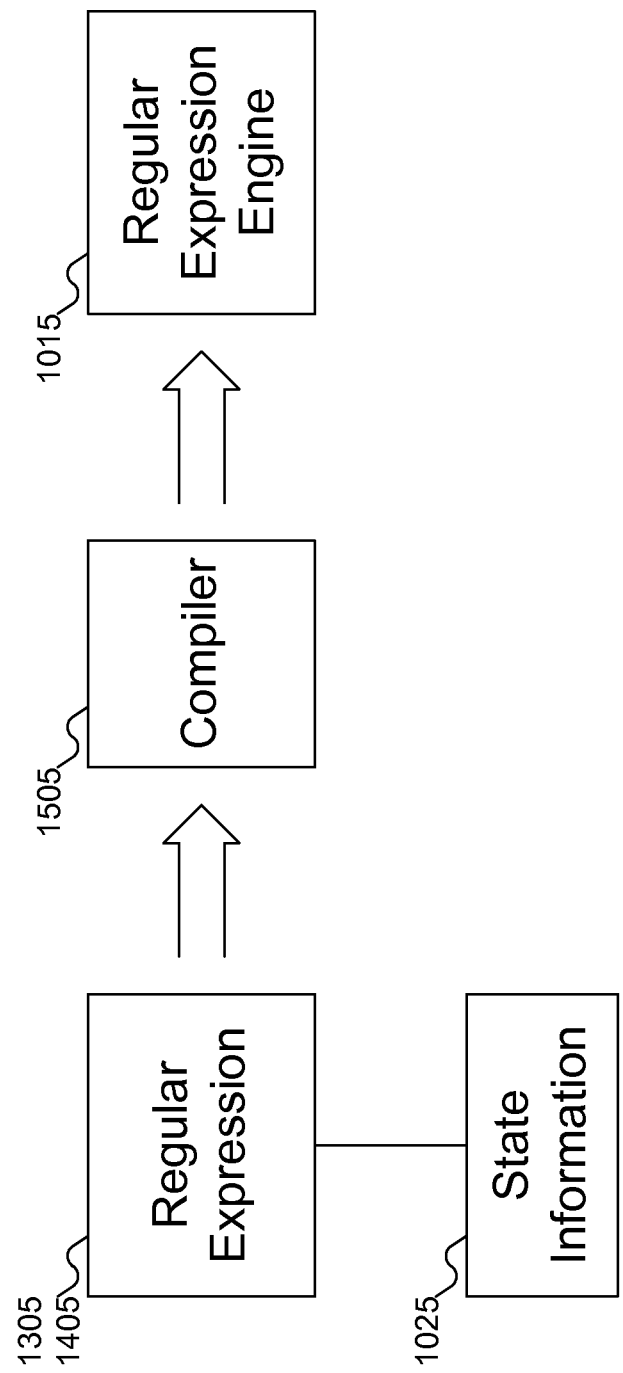

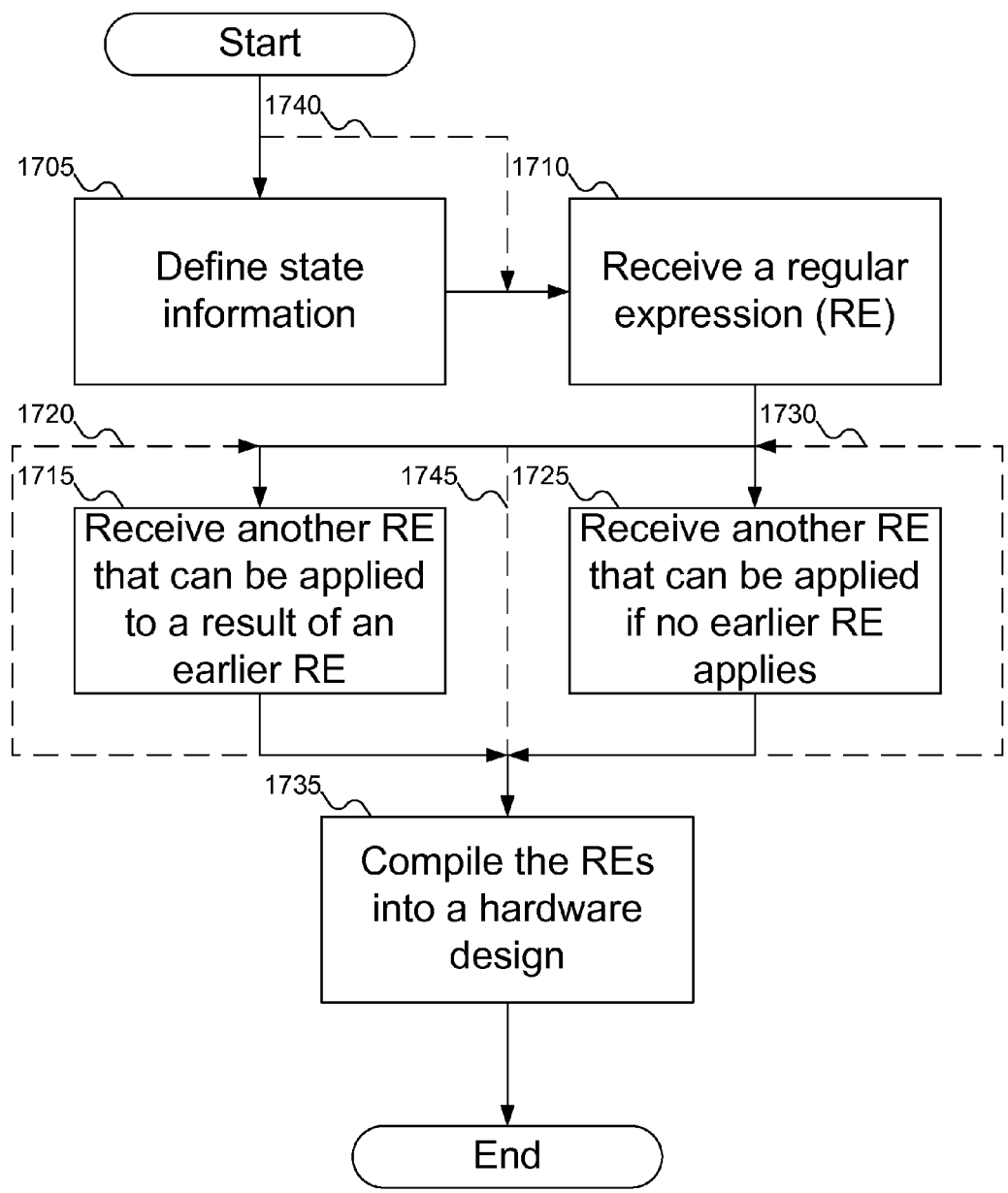

SERIAL BIT STREAM REGULAR EXPRESSION WITH STATES

RELATED APPLICATION DATA

This application claims the benefit of U.S. Provisional Patent Application Ser. No. 62/033,036, filed Aug. 4, 2014, which is hereby incorporated by reference in its entirety. This application is a continuation-in-part of U.S. patent application Ser. No. 12/949,703, titled "SERIAL BIT STREAM REGULAR EXPRESSION ENGINE", filed Nov. 18, 2010, which claims the benefit of U.S. Provisional Patent Application Ser. No. 61/266,966, filed Dec. 4, 2009, both of which are incorporated by reference herein in their entirety.

FIELD OF THE INVENTION

This invention relates to test and measurement instruments and, more particularly, to test and measurement instruments with regular expression processing of serial bit streams.

BACKGROUND

Regular expressions can be used in analyzing character streams. For example, programs such as Perl and AWK are based on regular expression pattern matching. A regular expression can be used to define a matching sequence of characters. However, such regular expression matching is performed on data that has already been converted into a byte, word, or other multi-bit format. In contrast, serial bit streams are not grouped into such multi-bit formats.

Parent U.S. patent application Ser. No. 12/949,703, titled "SERIAL BIT STREAM REGULAR EXPRESSION ENGINE", filed Nov. 18, 2010, describes how regular expressions can be applied to serial bit streams. And it is generally possible to implement any desired regular expression using the mechanism described in parent U.S. patent application Ser. No. 12/949,703, titled "SERIAL BIT STREAM REGULAR EXPRESSION ENGINE", filed Nov. 18, 2010. But describing the regular expression completely in this manner can be complicated. For comparison, in computer science any program can be written in machine language (using the bits 0 and 1). But implementation of a complex computer program in machine language is, at best, very tedious: at worst, it is effectively impossible to get correct. By writing the program in assembly language or a higher order programming language (for example, COBOL, Fortran, or C), implementation and debugging is simplified. Note that the higher order programming language does not give the programmer the ability to implement any program the machine language cannot support. If anything, the reverse is true: there may be instruction sequences that can be implemented in machine language that have no equivalent in the higher order programming language. But the simplified implementation makes the user of higher order programming languages advantageous over programming in machine language.

SUMMARY

A test and measurement instrument includes a user interface and a controller. The controller can receive a serial bit stream and apply a regular expression to the serial bit stream. The regular expression can include state information defined using a second regular expression. The controller can then present the results of applying the regular expression to the serial bit stream through the user interface.

BRIEF DESCRIPTION OF THE DRAWINGS

FIG. 15 shows a compiler taking a regular expression with state information and compiling it into a regular expression engine for use in the test and measurement instrument of FIG. 10.

FIG. 17 shows a flowchart of a procedure for compiling a regular expression into a design for use in a regular expression engine, according to an embodiment of the invention.

DETAILED DESCRIPTION

This disclosure describes embodiments of a test and measurement instrument with a regular expression engine for a serial bit stream.

Figure 1:
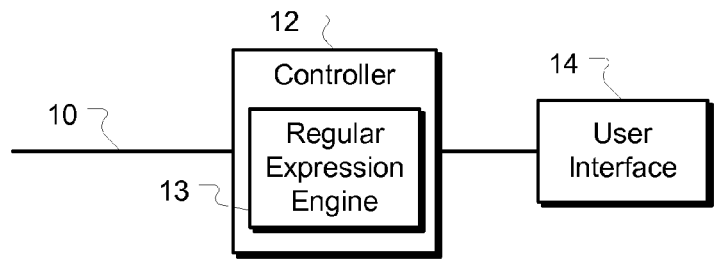
FIG. 1 is a block diagram of a test and measurement instrument with a regular expression engine according to an embodiment of the invention.

FIG. 1 is a block diagram of a test and measurement instrument with a regular expression engine according to an embodiment of the invention. The instrument includes a controller 12 configured to receive a serial bit stream 10. The serial bit stream 10 can be generated in a variety of ways. For example, the instrument can be an oscilloscope configured to digitize an input signal. The digitized input signal, which can be represented as a digitized analog signal, can represent digital data. That is, the digitized input signal can represent a series of bits of a data stream. The serial bit stream 10 can be such a series of bits extracted from the digitized input signal.

In another embodiment, the instrument can be a logic analyzer. The logic analyzer can be configured to compare an input signal to a threshold to generate a serial bit stream for a channel. The serial bit stream 10 can be such a bit stream from a channel of a logic analyzer. Any instrument that can generate a serial bit stream can include a regular expression engine as described herein.

In an embodiment, the serial bit stream 10 can, but need not be acquired immediately before processing by the controller 12. For example, the serial bit stream 10 can be stored in a memory. Such a memory could be an acquisition memory. In another example, the serial bit stream 10 can be stored in a non-volatile memory, such as a disk drive or other mass storage device.

Regardless of the source of the serial bit stream 10, the controller 12 can be configured to receive the serial bit stream 10. The controller 12 can be any variety of circuitry. For example, a digital signal processor (DSP), microprocessor, programmable logic device, general purpose processor, or other processing system with appropriate peripheral devices as desired can be used as the controller 12 to implement the functionality of a regular expression engine 13. Any variation between complete integration to fully discrete components can be used to implement the controller 12. The regular expression engine 13 represents the functionality of the controller 12 to apply a regular expression to the serial bit stream 10.

The controller 12 is coupled to a user interface 14. The user interface 14 can include any variety of interfaces. For example, the user interface 14 can include input interfaces such as buttons, knobs, sliders, keyboards, pointing devices, or the like. The user interface 14 can include output interfaces such as displays, lights, speakers, or the like. The user interface 14 can include input/output interfaces such as communication interfaces, touch screens, or the like. Any variety of user interfaces or combination of such interfaces can be used as the user interface.

The controller 12 can be configured to present acquired data (which can also be termed "output data", in that the "acquired data" is output from the test and measurement instrument) through the user interface in response to the application of the regular expression to the serial bit stream 10. In an embodiment, the acquired data can be the serial bit stream 10 itself. However, in other embodiments, the acquired data and the serial bit stream 10 can be different. For example, as will be described in further detail below, a match in the serial bit stream of a regular expression can be used to trigger other data to be acquired as the acquired data.

The regular expression engine 13 can be used to affect a variety of presentations of the serial bit stream 10. For example, as will be described in further detail below, data can be associated with a regular expression. The data can represent a symbol that was encoded in the matching bit sequence. The serial bit stream 10 can be presented with the symbol as an overlay, the symbol alone, or the like.

In another example, the regular expression engine 13 can be used for searching, marking, or otherwise identifying patterns in the serial bit stream 10, the associated data, or the like. For example, on an oscilloscope, a digitized waveform representing the acquired signal can be searched for a particular bit sequence. The associated sequence of the digitized waveform can be presented through the user interface. Alternatively, the associated sequence can be marked.

In another example, the regular expression engine 13 can be used to filter acquired data. For example, as will be described in further detail below, a regular expression can define a packet structure and matching values that match to only packets from a particular device. The acquisition of data can be filtered so that only matching acquisitions are stored.

In another embodiment, the output of the regular expression engine 13 can be more than mere matches. For example, the serial bit stream 10 can be associated with an acquired digitized waveform. The digitized waveform can be represented as values versus time. When a match is output, additional data, such as the time within the associated digitized waveform can be added to the output. Accordingly, the user interface 14 can be adjusted to reflect the time.

Figure 2:
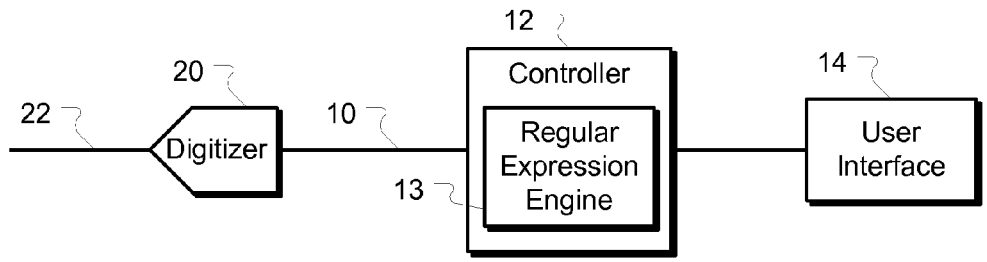
FIG. 2 is a block diagram of the test and measurement instrument of FIG. 1 with digitizer front end according to an embodiment of the invention.

FIG. 2 is a block diagram of the test and measurement instrument of FIG. 1 with digitizer front end according to an embodiment of the invention. The digitizer 20 can be configured to digitize an input signal 22 to generate the serial data stream 10.

Although not illustrated, each digitizer 26 can have a preamplifier, attenuators, filters, and/or other analog circuitry in the analog channel as needed. Thus, the input signals to the digitizers 26 can be amplified, attenuated, or otherwise filtered before digitization. In addition, the digitizers 26 can be and variety of circuitry that can digitize a signal. For example, the digitizers 26 can include circuitry such as track and hold circuits, A/D converters, de-multiplexer circuits as needed to sample the associated input signals.

Figure 3:
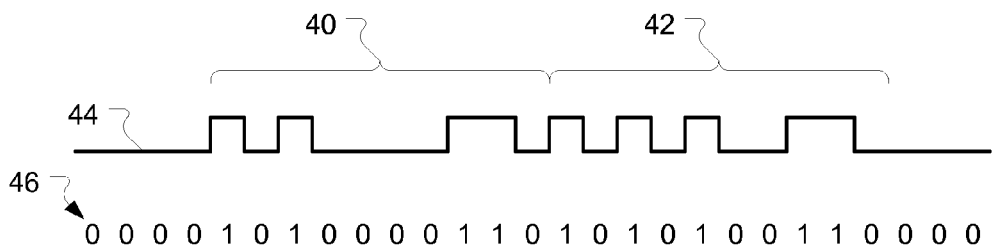
FIG. 3 illustrates a waveform, corresponding bit sequence, and matching bit sequences from a regular expression engine according to an embodiment of the invention.

FIG. 3 illustrates a waveform, corresponding bit sequence, and matching bit sequences from a regular expression engine according to an embodiment of the invention. In an embodiment, a regular expression grammar can be defined as:

```
<RegExpr> :=       1 | 0 | X
        |       <RegExpr> <RegExpr>
        |       <RegExpr> | <RegExpr>
        |       <RegExpr> +
        |       <RegExpr> *
        |       <RegExpr> ?
        |       <RegExpr> * INTEGER
        |       ( <RegExpr> )
        ;
```

In this example, matching bits can be defined as a 1, a 0, or a do-not-care X. A regular expression can be followed by a regular expression. An alternative regular expression can be defined by the OR "|" operator. One or more "+" or zero or more "*" operators can be used to define potentially a repeating regular expression. A "?" operator can mean zero or one of the preceding regular expression. An integer following the "*" operator can mean a repeating number of the regular expression. Parenthesis can be used to group a regular expression or series of regular expressions. Although a particular grammar has been described above, embodiments can use other grammars. In particular, further examples will be given below with other grammars. Furthermore, a grammar used by the regular expression engine 13 can, but need not implement all aspects of the above grammar or the following grammars.

Using the above grammar as an example, a regular expression can be defined for a match. For example, "1010000110" can be defined as a regular expression. A waveform 44 and the corresponding digital values 46 are illustrated in FIG. 3. Bit sequence 40 can be identified as a match as it has the bits "1010000110". However, bit sequence 42 would not match this sequence.

An alternative regular expression can be defined as "1010XX0110". In contrast to the above example, two do-not-care "X" values are included in the regular expression. Thus, both sequences 40 and 42 match the regular expression "1010XX0110".

Figure 4:
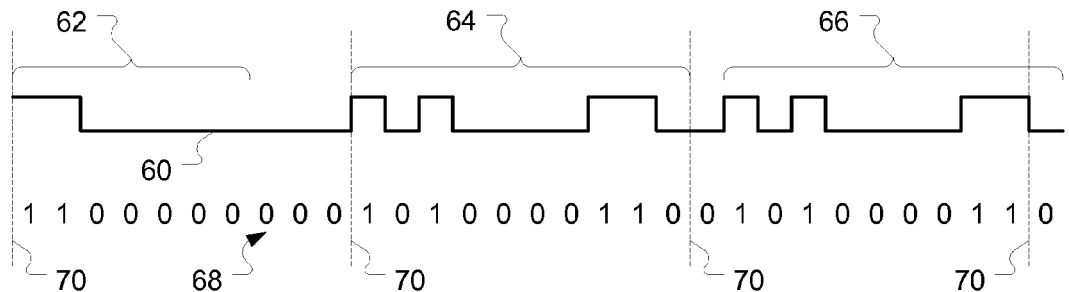
FIG. 4 illustrates a waveform, corresponding bit sequence, matching bit sequences, and an alignment sequence from a regular expression engine according to an embodiment of the invention.

FIG. 4 illustrates a waveform, corresponding bit sequence, matching bit sequences, and an alignment sequence from a regular expression engine according to an embodiment of the invention. In an embodiment, the regular expression engine 13 can be configured to align operations within the serial bit stream 10. For example, an encoding technique such as 8b/10b can define a particular sequence or sequences of bits that can be used for alignment. The sequences "1100000" or "0011111" within an 8b/10b encoding can indicate the 10 bit alignment within the serial bit stream.

A regular expression grammar can be defined to permit expression of such alignment sequences. For example, a regular expression with an alignment expression can be defined as:

```
<RegExprWithAlignment> :=        <RegExpr> <Alignment>
                          ;
<Alignment> :=           width <Expr>
         |               alignment <RegExpr>
         |               <Alignment> width <Expr>
         |               <Alignment> alignment <RegExpr>
         ;
```

Here, the operator "alignment" can indicate that the following regular expression defines a match for an alignment sequence within the serial bit stream 10. For example, using the above sequences, a regular expression of "alignment (1100000|0011111)" can be used to define either "1100000" or "0011111" as the alignment sequence.

In addition to an alignment sequence, a width can be specified. In this example grammar, the width operation can indicate a number of bits wide a "word" within the serial bit stream 10. For example, within 8b/10b encoding the width can be 10 bits. Accordingly, an alignment expression for 8b/10b encoding can be "alignment (1100000|0011111) width 10".

In particular, the definition of a width allows for alignment regular expression, such as those above, that are narrower or wider than the supplied width. In the above example, the alignment regular expression defines two 7-bit matching sequences with a 10 bit width. Thus, when the regular expression engine 13 increments an index into the serial bit sequence 10, the increment can be by the width. That is, in an embodiment, a regular expression may not be applied to each bit, but rather starting at bits in the serial bit stream 10 aligned according to the alignment regular expression.

Referring to FIG. 4, consider the regular expression "1010000110 alignment (1100000|0011111) width 10". Similar to FIG. 3, a waveform 60 and the corresponding digital values 68 are illustrated. A bit sequence 62 matches the alignment regular expression "(1100000|0011111)". With the defined width, application of the regular expression to the waveform 60 can be performed aligned according to the identified alignment bit sequence 62 and the defined width.

Dashed lines 70 delineate the boundaries of "words" within the waveform 60. In this example, both bit sequences 64 and 66 match the regular expression "1010000110". However, only bit sequence 64 is aligned to the boundaries 70. Thus, only bit sequence 64 and not bit sequence 66 would be a match.

In FIG. 4, a matching bit sequence 64 is illustrated as adjacent the alignment bit sequence 62; however, such proximity is not necessary. For example, in an embodiment, the controller can be configured to search the serial bit stream using the alignment regular expression. Once found, the regular expression engine 13 can be configured to apply a remainder of the regular expression in response to a match of the alignment regular expression. That is, the remainder can be applied aligned within the serial bit stream 10 and according to a defined width.

A match to the remainder of the regular expression may not be found until significantly after the alignment sequence. For example, the alignment bit sequence may have been discarded from an acquisition memory by the time a match to the remainder of the regular expression is found. However, the regular expression engine 13 can still operate aligned to the serial bit stream 10.

In other embodiments, the width can be implicitly defined by the alignment sequence. For example, an alignment regular expression of "alignment (1100000XXX|0011111XXX)" can operate substantially similarly with "alignment (1100000|0011111) width 10". That is, the regular expression engine 13 can be configured to determine that the width of the alignment regular expression is the width of a "word" within the serial bit stream 10.

In an embodiment, an alignment bit sequence may not be known or even exist; however a width may be known. For example, the alignment regular expression can be "width 10". In such a circumstance, an index referencing the serial bit stream 10 can be incremented in response to the width; however, an alignment may need to be determined.

A variety of techniques can be used to determine an alignment within the serial bit stream 10. For example, the regular expression engine 13 can be configured to apply the regular expression to the serial bit stream 10 using a number of indices referencing the serial bit stream 10 equal to a width of the regular expression. That is, the regular expression can be applied for each potential index within the serial bit stream 10 for a given width that would not duplicate an earlier similar alignment. For example, if the width is 10, an index of 0 can be substantially similar to an index of 10. The regular expression can be applied for each potential alignment at the level of granularity defined by the width. The index with the greatest number of matches to the regular expression can be selected as the index to be used.

In another embodiment, other techniques that can indicate an alignment can be used to determine an alignment index to be used with the serial bit stream 10. For example, with 8b/10b encoding a running disparity at the end of a symbol can be limited to a particular range. An offset index within the serial bit stream 10 where the running disparity is within the desired range can be used as the identified index. Although a particular examples of characteristics of the serial bit stream 10 that could be used to identify an offset index into the serial bit stream 10, any characteristic of the serial bit stream 10, the expected format, or the like that can indicate an alignment can be searched for over each of an index within a width to determine an appropriate index.

In an embodiment, a serial bit stream 10 can have a dynamic width. To accommodate the dynamic width, the controller 12 can be configured to search the serial bit stream 10 for a valid pattern. Once a valid pattern is identified, the position of the valid pattern can be used to align the regular expression to the serial bit stream 10.

In another example, the serial bit stream 10 can be decoded and checked for errors. If errors exist, exceed a threshold, or the like, the decoding of the serial bit stream 10 can be performed with another offset. Once an offset is found with a minimum of errors, that offset can be used to align the regular expression to the serial bit stream 10.

Although a variety of ways have been described to determine an alignment and/or a width of a word of a serial bit stream 10, other techniques can be used to obtain such information. In an embodiment, the controller 12 can be configured to receive an index referencing the serial bit stream 10 through the user interface 14. The index can be generated in a variety of way. For example, a user can supply an offset, width, or both. Such supplied information can be transformed into an index referencing the serial bit stream 10 by the user interface 14, the controller 12, or the like. Using this index, the controller can apply the regular expression to the serial bit stream 10.

In another example, a user can use a cursor position to define an offset index for the serial bit stream 10. The serial bit stream 10 may be presented through the user interface 14. A user can manipulate a cursor, whether manually, through some automated function, or the like, to indicate a position within the presented serial bit stream 10. In response, the controller 12 can determine a bit index referencing the serial bit stream 10. Thus, in circumstances where an alignment sequence is not available, has not been defined, or the like, a user can still examine data and indicate an alignment within the serial bit stream 10.

Figure 5:
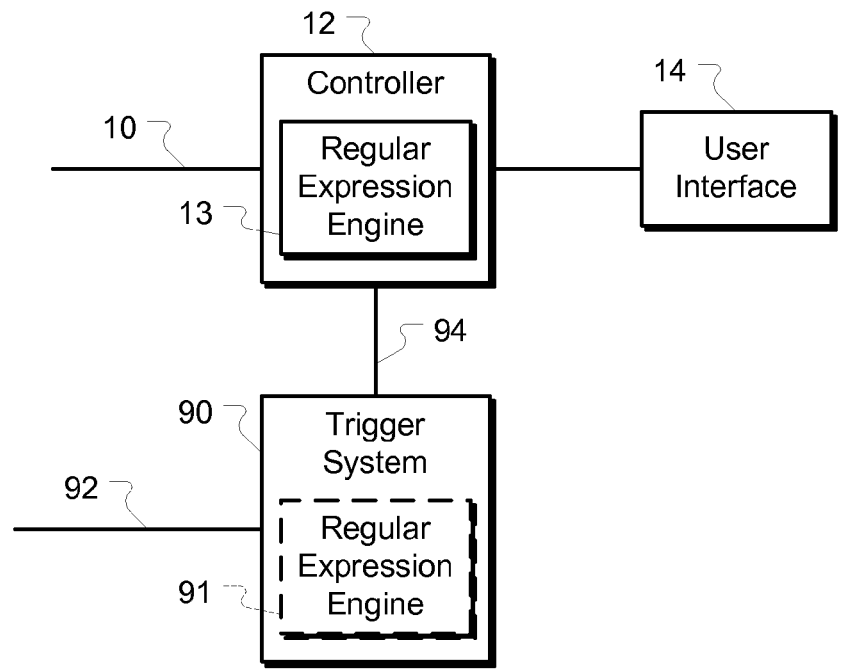
FIG. 5 is a block diagram of a test and measurement instrument with trigger system having a regular expression engine according to an embodiment of the invention.

FIG. 5 is a block diagram of a test and measurement instrument with trigger system having a regular expression engine according to an embodiment of the invention. The trigger system 90 can be configured to generate a trigger signal 94 in response to a trigger input 92. In an embodiment, the controller 12 can be configured to apply a regular expression with the regular expression engine 13 to the serial bit stream in response to the trigger signal 94.

For example, the controller 12 can be configured to use an index referencing the serial bit stream 10 associated with the trigger signal 94. The controller 12 can be configured to receive the trigger signal 94 from a trigger system 90. A bit of the serial bit stream 10 associated in time with the trigger signal 94, a bit at a particular offset from the trigger signal 94, or the like can be used as an alignment indicator for processing of the regular expression. Once alignment is established, the regular expression can be applied as described above.

In another embodiment, the trigger system 90 can have a regular expression engine 91. The regular expression engine 91 can be configured to apply a regular expression to a trigger input 92. In this example, the trigger input 92 can be a serial bit stream. Using the example described above, the regular expression can be "(1100000|0011111)". The trigger input 92 can be analyzed by the regular expression engine for a match. The trigger signal 94 can be generated in response to the match. In an embodiment, the trigger signal 94 can include an identified time or sample position, the matching expression, alignment information within the serial bit stream in the trigger input 92, the serial bit stream itself, a combination of such information, or the like. Such information can be provided to the controller 12 and used for the regular expression engine 13, used in acquiring data, or as otherwise desired.

As described above, the regular expression engine 13 can apply an associated regular expression to the serial data stream 10 aligned in response to the trigger signal 94. However, in this embodiment, the trigger signal 94 can be generated in response to the regular expression engine 91. As described above, the regular expression applied by the regular expression engine 91 of the trigger system 90 can be the alignment regular expression. Thus, the trigger system 90 can perform the processing to determine an alignment and the controller's 12 regular expression engine 13 can apply another regular expression to determine a match.

Figure 6:
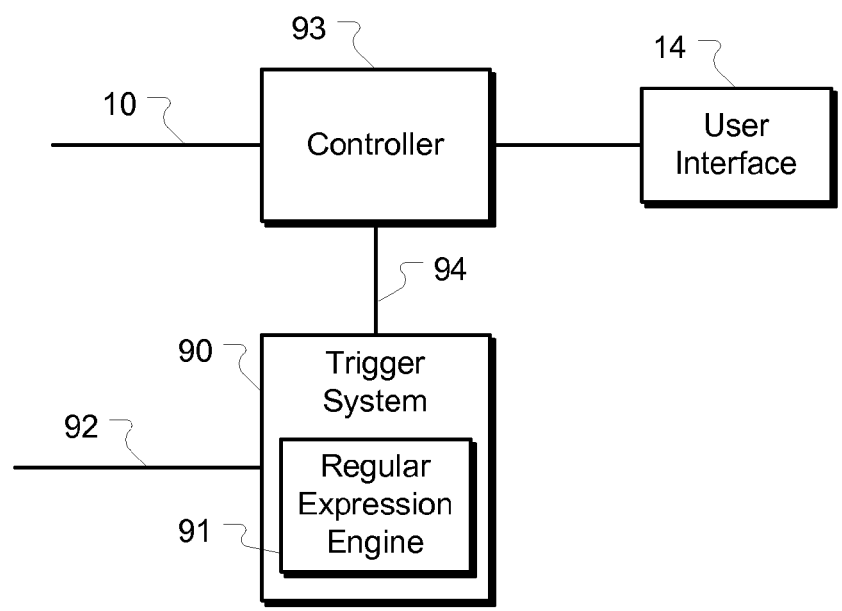
FIG. 6 is a block diagram of a test and measurement instrument with a regular expression engine in a trigger system according to an embodiment of the invention.

FIG. 6 is a block diagram of a test and measurement instrument with a regular expression engine in a trigger system according to an embodiment of the invention. Regular expression engine functionality can be distributed in a variety of ways. As described above, the regular expression functionality can be distributed across the controller 12 and trigger system 90. In this embodiment, the controller 93 need not have a regular expression engine. The regular expression engine 91 is part of the trigger system 90. The trigger system 90 can be configured to trigger an acquisition in response to a match of the regular expression to a serial bit stream of the trigger signal 92.

In an embodiment, such triggering can be used to acquire data only when a match occurs. For example, the instrument can acquire data from a shared medium. A regular expression can be defined that indicates a particular device, packet, source address, or the like. Accordingly, when signals are received from a matching source, only the corresponding data can be used. For example, a real-time data eye can be generated from such data. By using regular expressions only signals from a desired source can contribute to a data eye.

Figure 7:
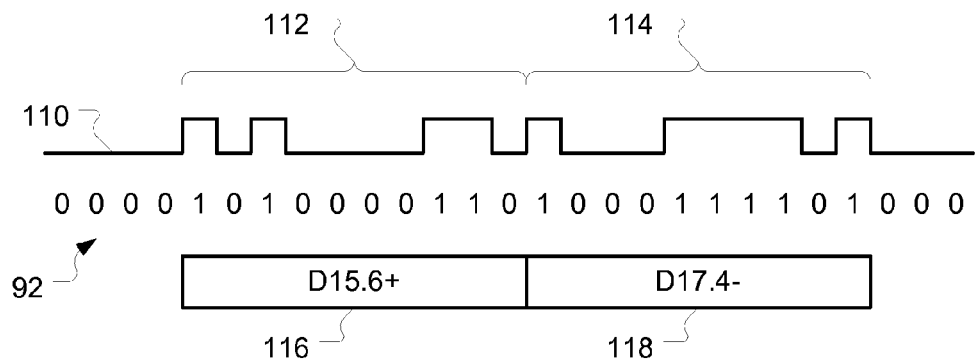
FIG. 7 illustrates a waveform, corresponding bit sequence, matching bit sequences, and associated data from a regular expression engine according to an embodiment of the invention.

FIG. 7 illustrates a waveform, corresponding bit sequence, matching bit sequences, and associated data from a regular expression engine according to an embodiment of the invention. In an embodiment, data can be present in a regular expression. For example, the following grammar allows for data to be described:

<RegExprWithData>:=<RegExpr>:<Data>

For clarity, the remainder of a regular expression grammar was not listed; however, the regular expression "<RegExprWithData>" can be used as any regular expression "<RegExpr>" described herein.

In one example, a regular expression "(1010000110: "D15.6+")" can associate the bit sequence "1010000110" with data "D15.6+". A waveform 110 and the corresponding bit sequence 92 are illustrated in FIG. 7. Bit sequence 112 matches "1010000110". Thus, the associated data "D15.6+" can be presented in box 116 through a user interface 14. Similarly, for a regular expression "(1000111101: "D17.4–")", box 118 can present the associated data "D17.4–" through the user interface 14 since bit sequence 114 matches that regular expression.

In an embodiment, using such data associations, a decoder can be implemented. For example, as described above, two bit sequences 112 and 114 were associated with symbols "D15.6+" and "D17.4–". "D15.6+" and "D17.4–" are symbols that are part of an 8b/10b encoding scheme. A regular expression defining the decoder can be defined as "((1000111100: "D17.3") 1 (1000111101: "D17.4–") . . . (1010000110: "D15.6+")) alignment (1100000|0011111) width 10". In this example, there are numerous other bit sequence to symbol relationships than the three described; however, the three are used as examples. Accordingly, if all of the bit sequences to symbol relationships are defined, then the regular expression can be used to decode the serial bit stream 10. As described above, source waveforms and/or bit streams need not be presented.

In an embodiment, such associated data can be used in subsequent operations of the instrument. For example, the controller can be configured to perform a search based on the data. Using the example above, a search can be performed for "D15.6+" symbols. In an embodiment, the underlying regular expression can, but need not, be hidden from a user. For example, various regular expressions can be predefined for particular symbols, loaded with a test setup, or the like. A user can select the data associated with the regular expression without needing information in the underlying regular expression.

Although text has been used as an example of data that can be associated with a regular expression, other types of information can be used as the data. For example, numbers, expressions, functions, or the like can be part of the associated data.

Figure 8:
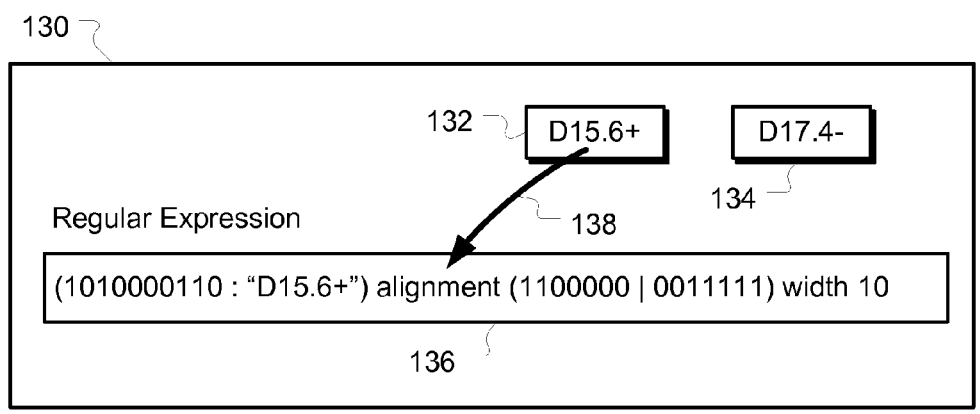
FIG. 8 is an example of a user interface of a test and measurement instrument with a regular expression engine according to an embodiment of the invention.

FIG. 8 is an example of a user interface of a test and measurement instrument with a regular expression engine according to an embodiment of the invention. In an embodiment the user interface 14 can be configured to present a regular expression. In one example, the user interface can be configured to present data of a previously defined regular expression.

Blocks 132 and 134 represent previously defined regular expressions presented in the user interface 130. For example, block 132 can represent the regular expression "(1010000110: "D15.6+") alignment (1100000|0011111) width 10" while block 134 can represent "(1000111101: "D17.4–") alignment (1100000|0011111) width 10"

A user input, such as a drag input of a pointing device is illustrated by arrow 138. Through this input, a user can indicate that an input box 136 for forming a regular expression can be filled in with the regular expression associated with block 132. For example, initially, box 136 could be empty. In response to the user input of arrow 138, box 136 is populated with the regular expression associated with block 132.

However, the regular expression in box 136 need not be expanded. That is, the regular expression in box 136 could remain represented by the data associated with the source regular expression. In this example, the data would be "D15.6+". Furthermore, more than one previously defined regular expression can be added in to the box 136. For example, a user could add block 134 to the box 136 to add the associated regular expression, add in operators, or the like In an embodiment, the presented regular expression can be any regular expression. As described above, block 132 had associated alignment and width terms. However, the associated regular expression could have been "(1010000110: "D15.6+")" without one or more of the alignment and width terms.

In another example, a previously defined regular expression could be "((1100000101|1010000110): "K28.5")". This regular expression could be presented as "K28.5". In response to a user input, the regular expression being formed could have the expanded "((1100000101|1010000110): "K28.5")". That is, the regular expression added in need not be limited to a mere sequence of literals, but can include any valid regular expression.

As a regular expression can be any valid regular expression, and these regular expressions can be relatively complex, even more complex regular expressions can be formed, potentially hiding the complexity from a user. For example, as described above, an 8b/10b decoder can be described as a regular expression. Similarly, other encoding schemes can be defined, such as 64b/66b. "8b/10b" could be presented in block 132 and "64b/66b" could be presented in block 134. A user could form a combined decoder for both 8b/10b and 64b/66b encodings. That is, the regular expression could be formed by a user dragging "8b/10b" into the box 136, entering an OR operator "|", and dragging "64b/66b" into the box 136.

Moreover, as the regular expressions added in can be any regular expression, such complex combinations need not be complete for each element. For example, the "8b/10b" regular expression may completely decode an 8b/10b bit stream; however the "64b/66b" regular expression may only define a portion of the associated encoding scheme. For example, the regular expression for "64b/66b" could be "(10|01)X*64 width 66".

Although a text box has been used as an example of a user interface for the formation of the regular expression, any interface that can allow a user to enter literals, operators, the previously defined regular expressions, or the like can be used in place of or in addition to the box 136.

Figure 9:
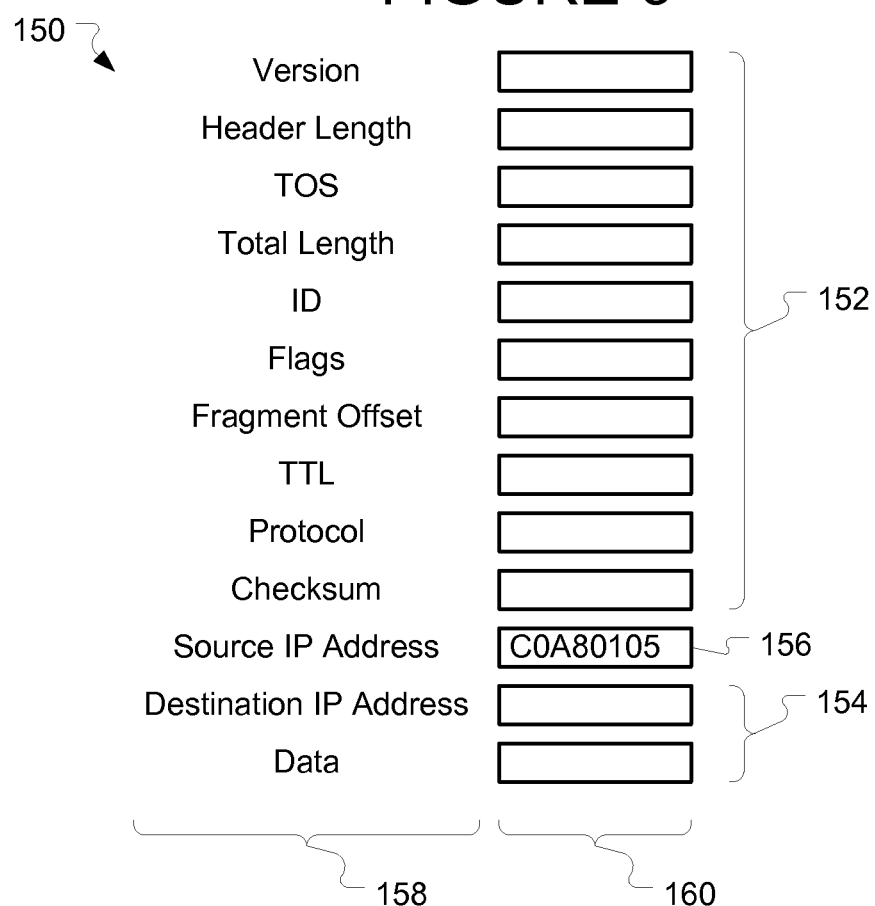
FIG. 9 is another example of a user interface of a test and measurement instrument with a regular expression engine according to an embodiment of the invention.

FIG. 9 is another example of a user interface of a test and measurement instrument with a regular expression engine according to an embodiment of the invention. A presentation 150 of a user interface is illustrated with field descriptions 158 and entry fields 160. In this example, a regular expression for an IP packet is described; however, other formats could be used. A grammar for defining a packet using regular expressions could be:

| <Packet> := | <BasePacket> |
| | <BasePacket> <Alignment> |
| ; | |
| <BasePacket> := | <Field> |
| | <Packet> ',' <Field> |
| ; | |
| <Field> := | '[' <RegExpr> ']' ':' ID |
| ; | |

In this example, a previously defined regular expression could be "[0000100000000000], [X*4]:Version, [X*4]: HeaderLength, [X*8]:TOS, [X*16]:TotalLength, [X*16]: ID, [X*3]:Flags, [X*13]:FragmentOffset, [X*8]:TTL, [X*8]:Protocol, [X*16]:Checksum, [X*32]:SourceIPAddr, [X*32]:DestIPAddr, [X*(TotalLength-20)*8]:Data" Here, the TotalLength ID could represent length in bytes. Hence, the amount of bits of the Data field would be TotalLength in bytes~20 header bytes times 8 bits per byte.

In an embodiment, for <Field> portions of the regular expression, corresponding labels and entry fields can be presented through the user interface 14. In this example, a user has left fields 152 and 154 blank and filled in field 156 with a value C0A80105 in hexadecimal, which represents a source IP address of 192.168.1.5. Accordingly, such user inputs can be used to generate a regular expression such as "[0000100000000000X*16], [X*16]:TotalLength, [X*54 11000000101010000000000100000101 X*32 X*(Total-Length-20)*8]". That is, fields 152 and 152 can be compressed if the fields are not filled in, values associated with elements can be added in to modify the regular expression, values can be expanded into bits, or the like.

In an embodiment, the ID parameter of a <Field> can be referenced in other locations of the regular expression. In this example, TotalLength is used in the Data field. In particular, the length of the number of matching bits in the Data field depends on the value of the TotalLength field. In one example, the TotalLength field can be a defined value, similar to the source IP address. In another example, the TotalLength field can be determined from a particular bit sequence being analyzed. That is, if the bits that are beginning to match the TotalLength field of the regular expression reference a value of "120", the number of matching bits in the Data field can be (120−20)*8 or 800 bits. Such a value can change for each application of the regular expression to a different bit sequence, starting location in a bit sequence, or the like.

In an embodiment, the regular expression engine can be configured to apply a regular expression in reverse. For example, a particular alignment sequence in a serial data stream 10 may occur after a bit sequence matching a regular expression. Accordingly, when an alignment sequence is found, the regular expression engine can be applied in reverse from the alignment sequence.

Another embodiment includes computer readable code embodied on a computer readable medium that when executed, causes the computer to perform any of the above-described operations. As used here, a computer is any device that can execute code. Microprocessors, programmable logic devices, multiprocessor systems, digital signal processors, personal computers, or the like are all examples of such a computer. In an embodiment, the computer readable medium can be a tangible computer readable medium that is configured to store the computer readable code in a non-transitory manner.

As described above, a test and measurement instrument can use a regular expression to match against a serial bit stream. But the regular expression grammar described above does not include state information. Therefore, another embodiment can be described that includes state information.

Figure 10:
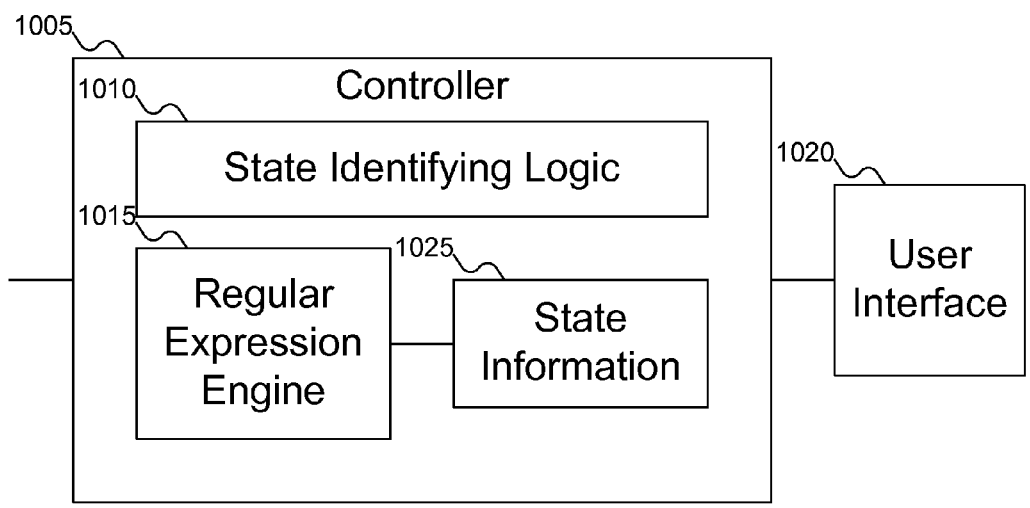
FIG. 10 shows a block diagram of a test and measurement instrument with a regular expression engine and state information, according to an embodiment of the invention.

FIG. 10 is a block diagram of a test and measurement instrument with a regular expression engine that includes state information according to an embodiment of the invention. The instrument includes controller 1005 configured to receive a serial bit stream. The serial bit stream can be generated in a variety of ways. For example, the instrument can be an oscilloscope configured to digitize an input signal. The digitized input signal, which can be represented as a digitized analog signal, can represent digital data. That is, the digitized input signal can represent a series of bits of a data stream. The serial bit stream can be such a series of bits extracted from the digitized input signal.

In another embodiment, the instrument can be a logic analyzer. The logic analyzer can be configured to compare an input signal to a threshold to generate a serial bit stream for a channel. The serial bit stream can be such a bit stream from a channel of a logic analyzer. Any instrument that can generate a serial bit stream can include a regular expression engine as described herein.

Controller 1005 can include state identifying logic 1010. State identifying logic 1010 can be logic that identifies states in the serial bit stream. State identifying logic 1010 can also modify the serial bit stream by changing the bits in the serial bit stream that identify states into state symbols that can be recognized by a regular expression. In this manner, state identifying logic 1010 can create a combined state/bit stream that includes state symbols as well as bits (0s and 1s). State identifying logic 1010 is discussed further below with reference to FIGS. 11-12.

It is also worth noting that the serial bit streams, and the state information identified in the serial bit streams, are time-ordered: that is the information has a sequence relative to time. Therefore, the combined state/bit stream is also time ordered.

In an embodiment, the serial bit stream can, but need not be acquired immediately before processing by controller 1005. For example, the serial bit stream can be stored in a memory. Such a memory could be an acquisition memory. In another example, the serial bit stream can be stored in a non-volatile memory, such as a disk drive or other mass storage device. Thus, the serial bit stream can be any desired data, including live data, data acquired by the test and measurement instrument, simulation data, or pre-recorded data.

Regardless of the source of the serial bit stream, controller 1005 can be configured to receive the serial bit stream. Controller 1005 can be any variety of circuitry. For example, a digital signal processor (DSP), microprocessor, programmable logic device, general purpose processor, or other processing system with appropriate peripheral devices as desired can be used as controller 1005 to implement the functionality of regular expression engine 1015. Any variation between complete integration to fully discrete components can be used to implement controller 1005. Regular expression engine 1015 represents the functionality of controller 1005 to apply a regular expression to the combined state/bit stream.

Controller 1005 is coupled to user interface 1020. User interface 1020 can include any variety of interfaces. For example, user interface 1020 can include input interfaces such as buttons, knobs, sliders, keyboards, pointing devices, or the like. User interface 1020 can include output interfaces such as displays, lights, speakers, or the like. User interface 1020 can include input/output interfaces such as communication interfaces, touch screens, or the like. Any variety of user interfaces or combination of such interfaces can be used as the user interface.

Controller 1005 can be configured to present output data through the user interface in response to the application of the regular expression to the combined state/bit stream. In an embodiment, the output data can be the serial bit stream itself, or the combined state/bit stream. However, in other embodiments, the output data and the serial bit stream or the combined state/bit stream can be different. For example, as will be described in further detail below, a match in the combined state/bit stream of a regular expression can be used to trigger other data to be used as the output data.

Regular expression engine 1015 can be used to affect a variety of presentations of the serial bit stream or the combined state/bit stream. For example, as described below, data can be associated with a regular expression. The data can represent a symbol that was encoded in the matching bit sequence. The serial bit stream or the combined state/bit stream can be presented with the symbol as an overlay, the symbol alone, or the like. Regular expression engine 1015 can also include state information 1025. State information 1025 can be used to define when and how regular expression engine 1015 operates. For example, a regular expression can be defined for a packet, and can have state information that defines the start and end of the packet. Without that state information, an identical bit sequence within the combined state/bit stream would not match the regular expression, and therefore not be recognized as output data.

In another example, regular expression engine 1015 can be used for searching, marking, or otherwise identifying patterns in the combined state/bit stream, the associated data, or the like. For example, on an oscilloscope, a digitized waveform representing the acquired signal can be searched for a particular bit sequence. The associated sequence of the digitized waveform can be presented through the user interface. Alternatively, the associated sequence can be marked.

In another example, regular expression engine 1015 can be used to filter acquired data. For example, as will be described in further detail below, a regular expression can define a packet structure and matching values that match to only packets from a particular device. The acquisition of data can be filtered so that only matching acquisitions are stored.

In another embodiment, the output of regular expression engine 1015 can be more than mere matches. For example, the serial bit stream can be associated with an acquired digitized waveform. The digitized waveform can be represented as values versus time. When a match is output, additional data, such as the time within the associated digitized waveform can be added to the output. Accordingly, user interface 1020 can be adjusted to reflect the time.

FIG. 10 as described is similar to FIG. 1, but modified to include state information. The embodiments shown in FIGS. 2-9 can be similarly modified to support state information, although such embodiments are not explicitly shown herein.

In contrast with the regular expression grammar described in parent U.S. patent application Ser. No. 12/949,703, titled "SERIAL BIT STREAM REGULAR EXPRESSION ENGINE", filed Nov. 18, 2010, the regular expression grammar can be enhanced to add additional semantics. The regular expression grammar can now be described as follows:

```
<PacketExpr> :=        1 | 0 | X
              |        INTEGER
              |        INTEGER : <IntExpr>
              |        STATEID
              |        ^
              |        $
              |        FIELDID
              |        FIELDID : <IntExpr>
              |        FIELDID * <IntExpr>
              |        <PacketExpr>, <PacketExpr>
              |        <PacketExpr> | <PacketExpr>
              |        <PacketExpr> +
              |        <PacketExpr> *
              |        <PacketExpr> ?
              |        <PacketExpr> # <IntExpr>
              |        ( <PacketExpr>)
<IntExpr> :=           ID
              |        INTEGER
              |        <IntExpr> + <IntExpr>
              |        <IntExpr> * <IntExpr>
              |        <IntExpr> / <IntExpr>
              |        ( <IntExpr>)
```

Aside from the inclusion of state elements in the regular expression, this regular expression grammar is also closer to how busses are typically defined in specification documents. By defining the regular expression grammar in manner more similar to bus specifications, it is easier for users to define specific regular expressions to identify within the combined state/bit stream, as users are generally familiar with bus specifications.

As in parent U.S. patent application Ser. No. 12/949,703, titled "SERIAL BIT STREAM REGULAR EXPRESSION ENGINE", filed Nov. 18, 2010, matching bits can be defined as a 1, a 0, or a do-not-care X. A regular expression can be an integer value, with or without a specified width. A regular expression can be a named State item. A regular expression can be a start state ("^") or a stop state ("$"). A regular expression can be a name of a field, with or without a specified with and in either most-significant-bit to least-significant-bit order or least-significant-bit to most-significant-bit order. A regular expression can be followed by a regular expression. An alternative regular expression can be defined by the OR "|" operator. One or more "+" or zero or more "*" operators can be used to define potentially a repeating regular expression. A "?" operator can mean zero or one of the preceding regular expression. An integer following the "*" operator can mean a repeating number of the regular expression. Parenthesis can be used to group a regular expression or series of regular expressions. Although a particular grammar has been described above, embodiments can use other grammars. In particular, further examples will be given below with other grammars. Furthermore, a grammar used by the regular expression engine 13 can, but need not implement all aspects of the above grammar or the following grammars.

While the contents of the packet can be defined as described in parent U.S. patent application Ser. No. 12/949,703, titled "SERIAL BIT STREAM REGULAR EXPRESSION ENGINE", filed Nov. 18, 2010, this does not necessarily give enough information to properly decode the serial bit stream. For example, it is necessary to know where a packet starts and stops. Otherwise, the serial bit stream might just include random noise, rather than actual data.

Figure 11:
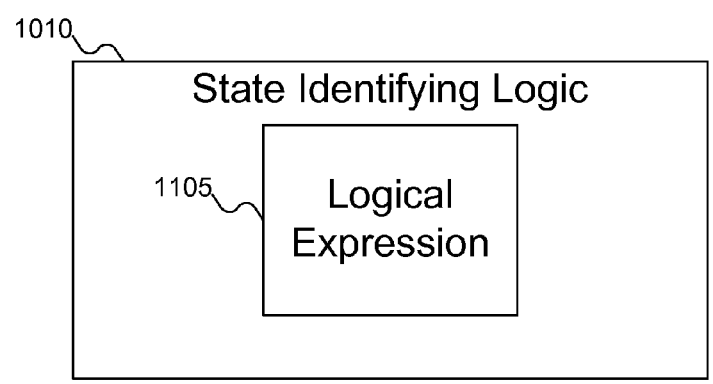
FIG. 11 shows the state identifying logic of FIG. 10 defining a state as a logical expression.

FIG. 11 shows the state identifying logic of FIG. 10 can identify states as logical expressions. For example, when the I²C bus is used, the start of a packet can be identified as logical expression 1105, wherein the data signal is falling and the clock signal is high. Similarly, the end of a packet can be defined as an event, wherein the data signal is rising and the clock signal is high. As software, these events can be described as:

events S=fall(sda)&&scl==1;
events P=rise(sda)&& scl==1;

These events can be used to scan the serial bit stream and identify the states, changing those pieces of information in the serial bit stream to tokens representing the start and end states (thereby producing the combined state/bit stream). These states can then be used as part of the regular expression for a packet. For example, a packet could then be defined as:

packet P7{S, Addr:7, RW, A, (Data:8, A)*, P};

A careful review of the description for packet P7 above will reveal that packet P7 uses a different syntax than that described in parent U.S. patent application Ser. No. 12/949,703, titled "SERIAL BIT STREAM REGULAR EXPRESSION ENGINE", filed Nov. 18, 2010: specifically, the Addr and Data fields use a different syntax. But a person skilled in the art will recognize that the different syntaxes describe the same concept: Addr:7 in the above syntax is functionally equivalent to [X*7]:Addr in the earlier syntax.

While FIG. 11 shows only one logical expression 1105, a person skilled in the art will recognize that there can be any number of states defined as events.

Figure 12:
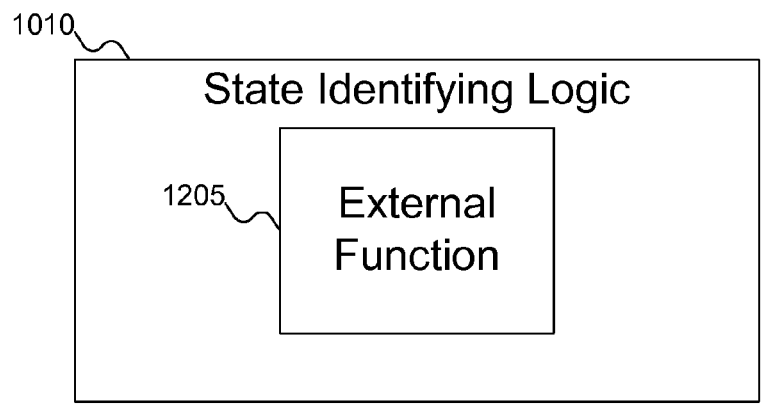
FIG. 12 shows the state identifying logic of FIG. 10 defining a state as an external function.

In contrast to FIG. 11, FIG. 12 shows the state identifying logic of FIG. 10 defined using an external expression 1205. For example, the start and end of the packet can be identified when the serial bit stream matches specific bit patterns. Again, while FIG. 12 shows only one external function 1205, a person skilled in the art will recognize that there can be any number of regular states defined as regular expressions.

In addition, the alternative embodiments shown in FIGS. 11 and 12 are not mutually exclusive. That is, some states can be defined as logical expressions and some states can be defined as external functions. In addition, states can potentially be defined in other manners, and these other definitions can be mixed with logical expressions and external functions, as desired.

Figure 13:
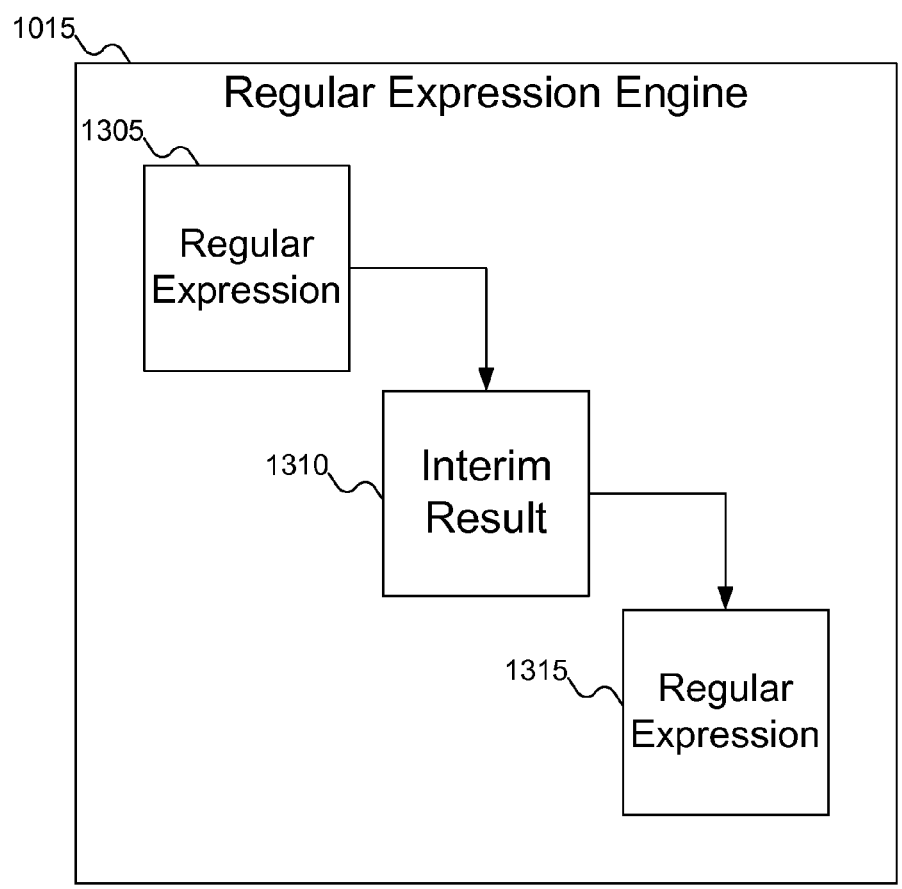
FIG. 13 shows the regular expression engine of FIG. 10 applying a second regular expression to the output of the first regular expression.

FIG. 13 shows the regular expression engine of FIG. 10 applying a second regular expression to the output of the first regular expression. In FIG. 13, regular expression engine 1015 includes regular expression 1305, which can be applied to the combined state/bit stream as described in parent U.S. patent application Ser. No. 12/949,703, titled "SERIAL BIT STREAM REGULAR EXPRESSION ENGINE", filed Nov. 18, 2010. The application of regular expression 1305 can produce interim result 1310, which can then be used as input to regular expression 1315. In this manner, the combined state/bit stream can sequentially be processed using multiple regular expressions. By using multiple regular expressions in sequence, various encoding can be achieved: for example, a Manchester encoding. A Manchester encoding uses two "bits" (in actually, signal level transitions" to represent a single bit of information. Thus, the first regular expression can convert the combined state/bit stream into the bit patterns as within the Manchester Encoding, and the second regular expression can then decode the information from the Manchester bit stream. More information can be found in Computer Networks, $3^{rd}$ Edition by Andrew S. Tanenbaum, pp. 279-80 (© 1996, published by Prentice-Hall, Inc.), which is hereby incorporated by reference for all purposes.

As an example of how to decode a Manchester encoding, the system receives a serial bit stream, such as:

1001010110010110101010

The two-bit value 10 can be matched and replaced with the one-bit value 1. The two-bit value 01 can be matched and replaced with the one-bit value 0. This creates a new bit stream that is binary encoded.

Except for alignment issues, the code below converts Manchester into a protocol that only encodes part of the bit stream using Manchester into a binary bit stream.

```
packet Data
{
    ^!,
    (D, [(01b:2 (0:1) | 10b:2 (1:1))+] {Data:16})+,
    $!
}
```

In the above example "D" refers to the Data State, "[(1:2(0:1)|2:2(1:1))+]" creates the new binary stream, "{Data:16}" divides the new bit stream into 16 bit words, and "+" repeats the match one or more times. The field definition "01b:2(0:1)" says to match a two-bit 1 and return a one-bit 0. The field definition "10b:2(1:1)" says to match a two-bit 2 and return a one-bit 1. Either a 1 or 2 is a match: anything else causes the match to fail. This is repeated one or more times (until the match fails) and a new binary stream is created that is fed to the subsequent field match definition.

FIG. 13 shows the application of two regular expressions 1305 and 1315. But a person skilled in the art will recognize that there can be any number of serially-applied regular expressions, as desired. Thus, there can be three, four, or even more regular expressions, each applied to the output of the previous regular expression, with the output of the final regular expression being the output data.

Figure 14:
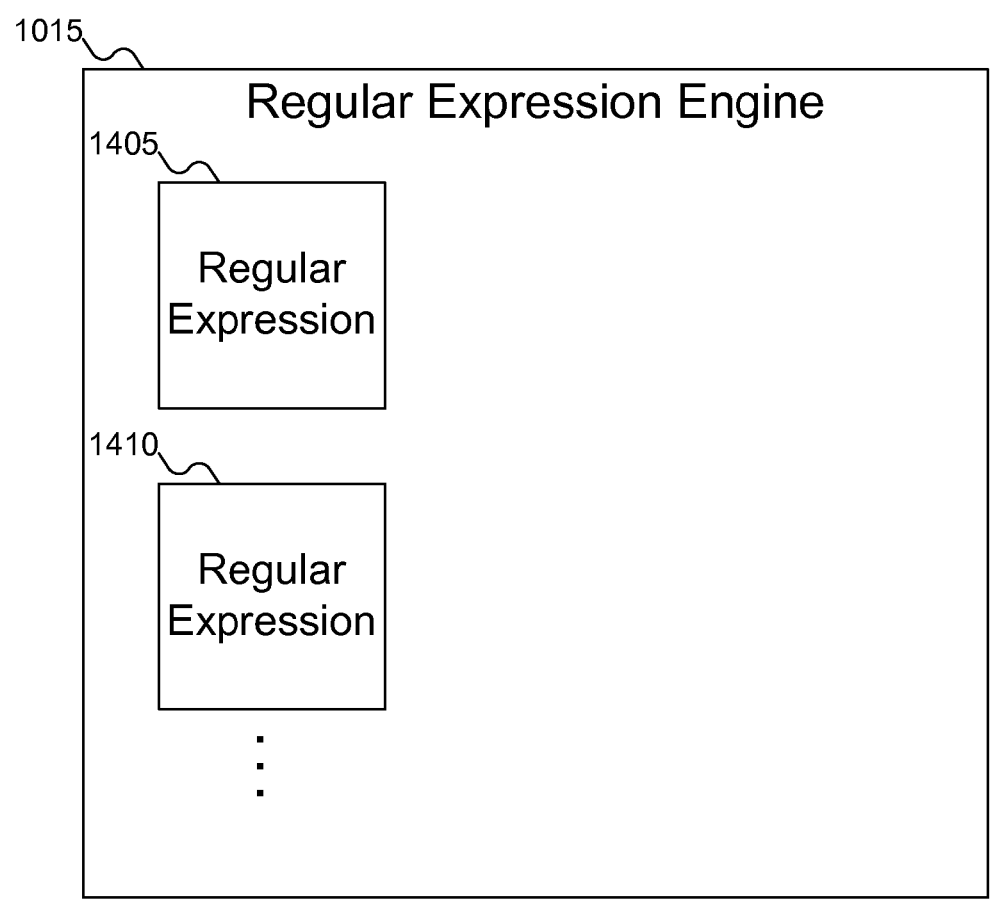
FIG. 14 shows the regular expression engine of FIG. 10 applying more than one regular expression to a serial bit stream.

In contrast to FIG. 13, where regular expressions are applied sequentially to the data from the previous regular expression, it is also possible to establish different regular expressions that can match different information within the combined state/bit stream. That is, there is no guarantee that any particular regular expression within a test and measurement instrument might necessarily match any (let alone all) data in the combined state/bit stream. This can occur, for example, if the test and measurement instrument is used with data encoded in different ways. To address this situation, the test and measurement instrument can include more than one regular expression, any of which can be used to match information from the combined state/bit stream. FIG. 14 demonstrates this situation.

In FIG. 14, the regular expression engine of FIG. 10 can apply more than one regular expression to a combined state/bit stream. Specifically, regular expression engine 1015 can include regular expressions 1405 and 1410, each of which can potentially match data within the combined state/bit stream. In one embodiment, regular expression engine 1015 can apply each of regular expressions 1405 and 1410 in turn, until the combined state/bit stream matches one of the regular expressions. The order in which regular expressions 1405 and 1410 are applied can be defined in any desired manner: for example, by their order of definition. In another embodiment, regular expression engine 1015 can apply all of regular expressions 1405 and 1410 at the same time, looking for a match. In yet another embodiment, different portions of the combined state/bit stream can match different regular expressions.

While FIG. 14 shows two regular expressions 1405 and 1410, a person skilled in the art will recognize that there can be any number of regular expressions within regular expression engine 1015.

A person of ordinary skill in the art will recognize that the regular expression engine described above is essentially a form of a Turing machine. A Turing machine is an abstraction used in computer science. A Turing machine consists of a tape, divided into cells: the tape is generally assumed to be infinite in length. The Turing machine also has a head that can be used to read and/or write a symbol from a single cell on the tape. After reading or writing a symbol, the head can then move one cell left or right on the tape. The Turing machine also has a state register that represents the current state of the Turing machine. Finally, the Turing machine has a table of instructions how to proceed. Typically, each instruction in the table can be thought of as a tuple that includes a current state, and a current symbol read from the tape, and identifies the next state to use, the symbol to write to the tape, and the direction in which to advance the tape (left or right).

Computer science theory demonstrates that a single Turing machine can simulate the operation of multiple Turing machines. That is, given the definition of two or more Turing machines, it is possible to define a single Turing machine that performs the operations of all of these separate Turing machines. Thus, it is possible to devise a single Turing machine that can analyze the same data as multiple Turing machines might do separately.

Computer science theory also demonstrates that a single Turing machine can simulate the operation of two Turing machines in sequence. That is, given one Turing machine that operates on an input data and a second Turing machine that can take the output of the first Turing machine and process it in a different manner, it is possible to define a single Turing machine that achieves the same result.

Another useful analogy is the coding of software. Software can be implemented in a single subroutine. But this makes implementation, debugging, and maintenance difficult. Modularizing the software makes implementation, debugging, and maintenance simpler.

In a similar manner, it is possible to define regular expressions that achieve the results of the serial application of regular expressions, or multiple independent regular expressions, as shown in FIGS. 13-14. But the definition of these regular expressions can be very complicated. Defining the individual regular expressions and applying them alternatively or sequentially is easier than defining a single regular expression that achieves the more complicated overall result. Thus, the claimed invention provides an advantage over parent U.S. patent application Ser. No. 12/949,703, titled "SERIAL BIT STREAM REGULAR EXPRESSION ENGINE", filed Nov. 18, 2010.

FIG. 15 shows a compiler taking a regular expression with state information and compiling it into a regular expression engine for use in the test and measurement instrument of FIG. 10. In FIG. 15, compiler 1505 receives regular expression 1305, 1405, with state information 1025. Compiler 1505 then uses that information to generate regular expression engine 1015. Compiler 1505 can accomplish this because regular expression 1305, 1405 effectively describes a state machine for recognizing a combined state/bit stream that matches regular expression 1305, 1405. Compiler 1505 can use that state machine to define the states and transitions that make up regular expression engine 1015.

Because compiler 1305, 1405 can take regular expression 1305, 1405 and generate from it regular expression engine 1015, a person skilled in the art will recognize that the only difference between regular expression 1305, 1405 and regular expression engine 1015 is the implementation: they both describe ways to match a serial bit stream or a combined state/bit stream with a particular expression. Therefore, while regular expression 1305, 1405 and regular expression engine 1015 are actually different constructs, these terms represent the same basic underlying concept. Therefore, the terms "regular expression engine" and "regular expression" can be used effectively interchangeably, and the specific term intended can be understood from context.

Figure 16A:
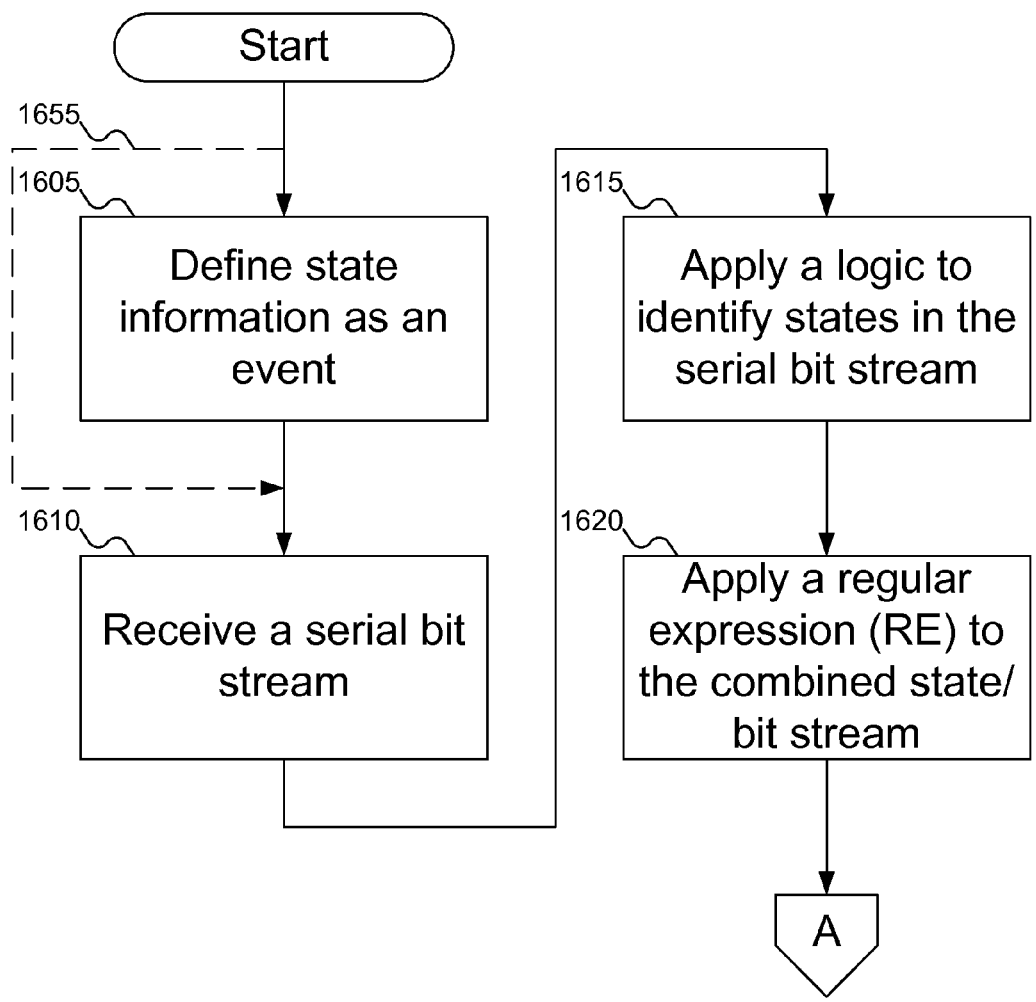
FIGS. 16A-16B show a flowchart of a procedure for using regular expressions with state information, according to an embodiment of the invention.
Figure 16B:
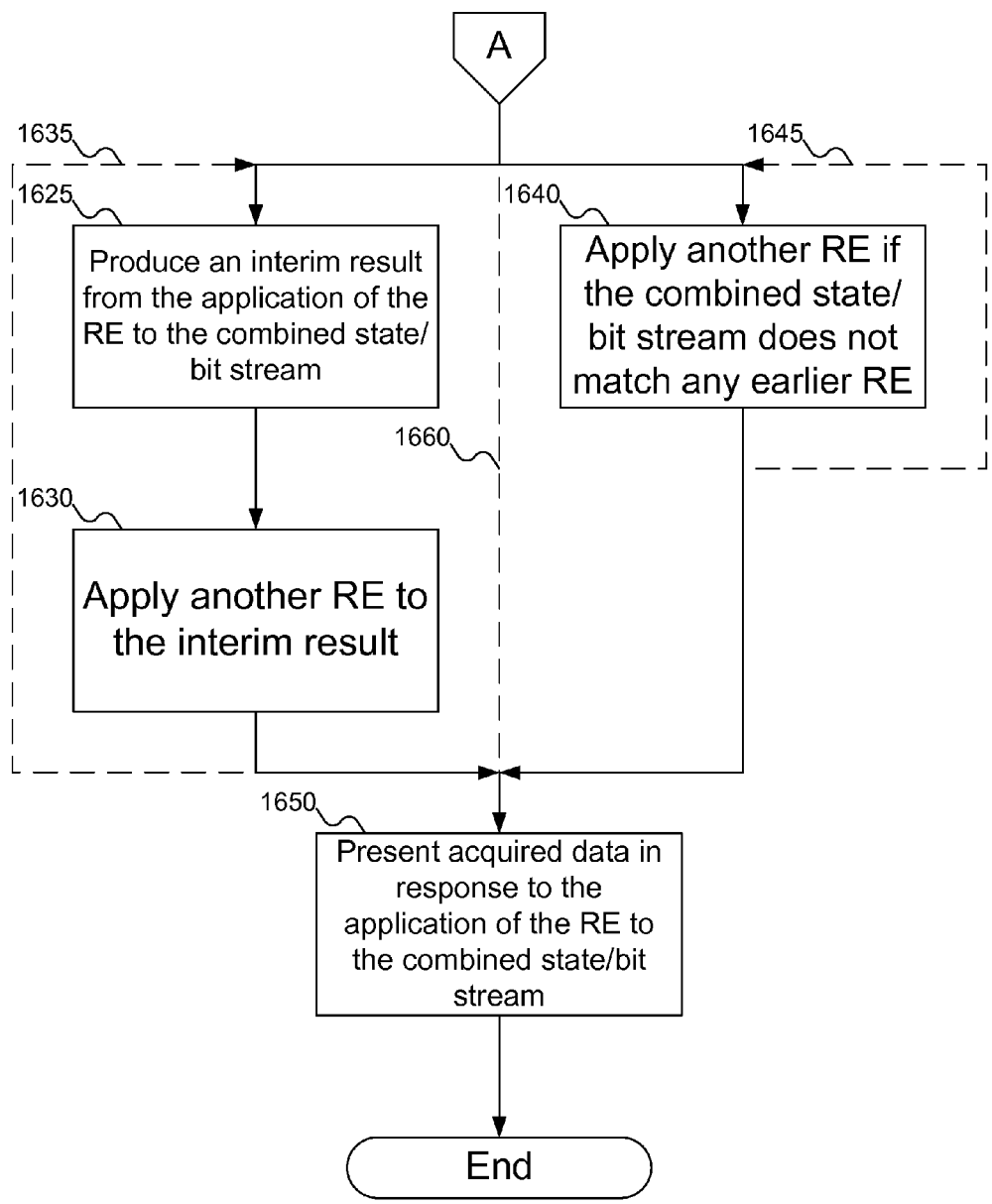

FIGS. 16A-16B show a flowchart of a procedure for using regular expressions with state information, according to an embodiment of the invention. In FIG. 16A, at block 1605, state information is defined. At block 1610, a serial bit stream is received. At block 1615, a logic to identify states is applied to the serial bit stream, producing a combined state/bit stream. At block 1620, a regular expression is applied to the combined state/bit stream.

At block 1625 (in FIG. 16B), an interim result is produced from the regular expression. This interim result is then input to a second regular expression engine in block 1630. Blocks 1625 and 1630 can repeated additional times if additional regular expressions are to be applied, as shown by dashed arrow 1635.

In the alternative, rather than applying multiple regular expressions sequentially as shown in blocks 1625 and 1630, at block 1640 a second regular expression can be applied if the combined state/bit stream did not match the first regular expression. Block 1640 can be repeated additional times if additional regular expressions are to be tried following subsequent failures to match, as shown by dashed arrow 1645.

Finally, at block 1650, the results of the regular expression(s) can be presented as output data to the user.

FIG. 17 shows a flowchart of a procedure for compiling a regular expression into a design for use in a regular expression engine, according to an embodiment of the invention. In FIG. 17, at block 1705, state information is defined as an event. At block 1710, a regular expression is received. At block 1715, a second regular expression can be received that can be applied sequentially. As shown by dashed arrow 1720, block 1715 can be repeated multiple times, depending on how many regular expressions are to be received.

In the alternative, rather than applying multiple regular expressions sequentially as shown in block 1715, at block 1725 a second regular expression can be received to be used if the combined state/bit stream does not match the first regular expression. As shown by dashed arrow 1730, block 1725 can be repeated multiple times, depending on how many regular expressions are to be received.

Finally, at block 1735, the received regular expressions can be compiled into a hardware design.

FIGS. 16A-16B and 17 described above represent various possible embodiments of the invention. Embodiments of the invention are not limited to those shown in the flowcharts. Various blocks can be omitted, and the order of blocks can be rearranged, without loss of generality to embodiments of the invention. Thus, for example, dashed lines 1655 in FIG. 16A, dashed line 1660 in FIG. 16B, and dashed lines 1740 and 1745 in FIG. 17 represent some ways in which the blocks can be skipped. These examples of how to modify the flowcharts are merely illustrative, and are not intended to describe the only ways in which the flowcharts can be modified.

The following discussion is intended to provide a brief, general description of a suitable machine in which certain aspects of the invention may be implemented. Typically, the machine includes a system bus to which is attached processors, memory, e.g., random access memory (RAM), read-only memory (ROM), or other state preserving medium, storage devices, a video interface, and input/output interface ports. The machine may be controlled, at least in part, by input from conventional input devices, such as keyboards, mice, etc., as well as by directives received from another machine, interaction with a virtual reality (VR) environment, biometric feedback, or other input signal. As used herein, the term "machine" is intended to broadly encompass a single machine, or a system of communicatively coupled machines or devices operating together. Exemplary machines include computing devices such as personal computers, workstations, servers, portable computers, handheld devices, telephones, tablets, etc., as well as transportation devices, such as private or public transportation, e.g., automobiles, trains, cabs, etc.

The machine may include embedded controllers, such as programmable or non-programmable logic devices or arrays, Application Specific Integrated Circuits, embedded computers, smart cards, and the like. The machine may utilize one or more connections to one or more remote machines, such as through a network interface, modem, or other communicative coupling. Machines may be interconnected by way of a physical and/or logical network, such as an intranet, the Internet, local area networks, wide area networks, etc. One skilled in the art will appreciated that network communication may utilize various wired and/or wireless short range or long range carriers and protocols, including radio frequency (RF), satellite, microwave, Institute of Electrical and Electronics Engineers (IEEE) 810.11, Bluetooth, optical, infrared, cable, laser, etc.

The invention may be described by reference to or in conjunction with associated data including functions, procedures, data structures, application programs, etc. which when accessed by a machine results in the machine performing tasks or defining abstract data types or low-level hardware contexts. Associated data may be stored in, for example, the volatile and/or non-volatile memory, e.g., RAM, ROM, etc., or in other storage devices and their associated storage media, including hard-drives, floppy-disks, optical storage, tapes, flash memory, memory sticks, digital video disks, biological storage, etc. Associated data may be delivered over transmission environments, including the physical and/or logical network, in the form of packets, serial data, parallel data, propagated signals, etc., and may be used in a compressed or encrypted format. Associated data may be used in a distributed environment, and stored locally and/or remotely for machine access.

Having described and illustrated the principles of the invention with reference to illustrated embodiments, it will be recognized that the illustrated embodiments may be modified in arrangement and detail without departing from such principles. And, though the foregoing discussion has focused on particular embodiments, other configurations are contemplated. In particular, even though expressions such as "in one embodiment" or the like are used herein, these phrases are meant to generally reference embodiment possibilities, and are not intended to limit the invention to particular embodiment configurations. As used herein, these terms may reference the same or different embodiments that are combinable into other embodiments.

What is claimed is:

1. A test and measurement instrument, comprising:
a user interface; and
a controller configured to:
  receive a serial bit stream;
  analyze the serial bit stream to identify, via state identification logic, states within the serial bit stream, wherein the state identification logic defines conditions associated with each of the states;
  generate a combined state/bit stream from the serial bit stream based, at least in part, on the identified states;
  apply a first regular expression, that includes first state information, to the combined state/bit stream to produce output data;
  detect that the first regular expression fails to match the combined state/bit stream;
  in response to the detection that the first regular expression fails to match the combined state/bit stream, apply a second regular expression, including second state information, to the combined state/bit stream to produce the output data; and
  present the output data through the user interface in response to the application of the regular expression to the combined state/bit stream.

2. The test and measurement instrument of claim 1, wherein the state identification logic includes a state regular expression that defines the conditions associated with one or more of the states within the bit stream.

3. The test and measurement instrument of claim 1, wherein the state identification logic includes an external function that defines the conditions associated with one or more of the states within the bit stream.

4. The test and measurement instrument of claim 1, wherein the combined state/bit stream is time ordered.

5. The test and measurement instrument of claim 1, wherein the second regular expression comprises an interim regular expression and a subsequent regular expression, and wherein the controller is further configured to apply the interim regular expression to the combined state/bit stream to produce an interim result, and to apply the subsequent regular expression to the interim result to produce the output data.

6. The test and measurement instrument of claim 1, wherein the first regular expression defines a first packet type and the second regular expression defines a second packet type.

7. A method, comprising:
receiving a serial bit stream;
analyzing the serial bit stream to identify, via state identifying logic, states within the serial bit stream, wherein the state identification logic defines conditions associated with each of the states;
generating a combined state/bit stream from the serial bit stream based, at least in part, on the identified states;
detecting that a first regular expression, that includes first state information, fails to match the combined state/bit stream;
in response to the detecting, applying a second regular expression, that includes second state information, to the combined state/bit stream to produce output data; and
outputting the output data for additional analysis in response to the application of the second regular expression to the combined state/bit stream.

8. The method of claim 7, wherein the state identifying logic includes a state regular expression to identify one or more of the states within the serial bit stream.

9. The method of claim 7, wherein the state identifying logic includes an external function to identify one or more of the states within the serial bit stream.

10. The method of claim 7, wherein the combined state/bit stream is time ordered.

11. The method of claim 7, wherein applying the second regular expression to the combined state/bit stream includes:
applying an interim regular expression to the combined state/bit stream to produce an interim result based on the interim regular expression; and
applying a subsequent regular expression to the interim result to produce the output data.

12. The method of claim 7, wherein generating the combined state/bit stream from the serial bit stream comprises association or replacement of bits in the serial bit stream that were utilized to identify one of the states with a state symbol associated with the one of the states.

13. The method of claim 7, wherein the first regular expression defines a first packet type and the second regular expression defines a second packet type.

14. One or more non-transitory computer-readable storage media having instructions stored thereon, which, when executed by a test and measurement instrument, cause the test and measurement instrument to:
analyze a serial bit stream to identify, via state identification logic, states within the serial bit stream, wherein the state identification logic defines conditions associated with each of the states;
generate a combined state/bit stream from the serial bit stream based, at least in part, on the identified states;
detect that a first regular expression, that includes first state information, fails to match the combined state/bit stream;
in response to the detecting, apply a second regular expression, that includes second state information, to the combined state/bit stream to produce output data; and
output the output data, in response to the application of the second regular expression to the combined state/bit stream, for additional analysis.

15. The one or more non-transitory computer-readable media of claim 14, wherein the state identification logic includes a state regular expression and/or an external function.

16. The one or more non-transitory computer-readable media of claim 14, wherein to generate the combined state/bit stream from the serial bit stream comprises association or replacement of bits in the serial bit stream that were utilized to identify one of the states with a state symbol associated with the one of the states.

17. The one or more non-transitory computer-readable media of claim 14, wherein the combined state/bit stream is time ordered.

18. The one or more non-transitory computer-readable media of claim 14, wherein to apply the second regular expression, the instructions cause the test and measurement system to: apply an interim regular expression to the combined state/bit stream to produce an interim result, and to apply one or more additional regular expressions to the interim result to produce the output data.

19. The one or more non-transitory computer-readable media of claim 14, wherein the first regular expression defines a first packet type and the second regular expression defines a second packet type.

* * * * *